United States Patent
Nakai

(10) Patent No.: US 7,239,546 B2
(45) Date of Patent: Jul. 3, 2007

(54) SEMICONDUCTOR DEVICE WITH A NONVOLATILE SEMICONDUCTOR MEMORY CIRCUIT AND A PLURALITY OF IO BLOCKS

(75) Inventor: Nobuyuki Nakai, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 77 days.

(21) Appl. No.: 11/008,960

(22) Filed: Dec. 13, 2004

(65) Prior Publication Data

US 2005/0157570 A1    Jul. 21, 2005

(30) Foreign Application Priority Data

Jan. 20, 2004    (JP) ............... 2004-011848

(51) Int. Cl.
*G11C 16/04* (2006.01)

(52) U.S. Cl. .................. 365/185.05; 365/185.09; 365/185.11

(58) Field of Classification Search ........... 365/185.05, 365/185.09, 185.11
See application file for complete search history.

(56) References Cited

U.S. PATENT DOCUMENTS

| | | | | |
|---|---|---|---|---|
| 5,673,221 A | * | 9/1997 | Calligaro et al. | ........... 365/168 |
| 5,956,277 A | * | 9/1999 | Roohparvar | ................. 365/201 |
| 6,088,252 A | * | 7/2000 | Fujisawa et al. | ............... 365/51 |
| 6,373,327 B1 | * | 4/2002 | Nakamura | ................... 327/536 |
| 6,944,072 B2 | * | 9/2005 | Micheloni et al. | ........... 365/200 |
| 2003/0112652 A1 | * | 6/2003 | Shimada et al. | ............. 365/154 |
| 2004/0004879 A1 | | 1/2004 | Ishibashi et al. | |
| 2004/0023451 A1 | * | 2/2004 | Lee et al. | .................... 438/201 |

OTHER PUBLICATIONS

T. Takahashi, et al.; "A Multi-Gigabit DRAM Technology with 6F$^2$ Open-Bit-Line Cell Distributed Over-Driven Sensing and Stacked-Flash Fuse," ISSCC 2001/Session 24/DRAM/24.2, 2001 IEEE International Solid-State Circuits Conference, pp. 380-468.

* cited by examiner

*Primary Examiner*—Hoai V. Ho
(74) *Attorney, Agent, or Firm*—Stevens, Davis, Miller & Mosher, LLP

(57) ABSTRACT

Only by replacing a conventional fuse element used for a redundant repair of a memory with a CMOS device, since physical processing is not required, there is an advantage on a circuit area in which the upper interconnection can be utilized. However, on a design of a semiconductor device, since the CMOS device requires application of a high voltage for rewriting, there is a problem of being subjected constraint of an arrangement of an interconnection or a semiconductor circuit. For that reason, by arranging the nonvolatile semiconductor memory circuit provided with the nonvolatile memory device which is constituted of a CMOS device between the IO blocks arranged at the periphery of the chip, physical processing due to replacing the conventional fuse element with the CMOS device will not be needed, so that while keeping an advantage on a circuit area that the upper interconnection can be utilized, the problem of the arrangement in consideration of high voltage application can be resolved.

11 Claims, 2 Drawing Sheets

SEMICONDUCTOR DEVICE WITH A NONVOLATILE SEMICONDUCTOR MEMORY CIRCUIT AND A PLURALITY OF IO BLOCKS

BACKGROUND OF THE INVENTION

1. Field of the Invention

The present invention relates to a semiconductor device.

2. Description of the Prior Art

In a field of a semiconductor integrated circuit device in recent years, high integration owing to progress of a microfabrication technology has been increasingly accelerated in conjunction with a competition between semiconductor makers. At the same time, cost reduction is also an imperative for these semiconductor makers, and not only in a field of a general-purpose memory, such as general-purpose DRAM and synchronous DRAM, but also in a field of a system LSI where a microprocessor, ASIC, custom logic or the like and a memory are built into one chip, in order to satisfy above imperative, a method of improving a yield by employing a redundant repair technology using a fuse in which a faulty memory cell generated in a manufacturing step is replaced with a spare memory cell has become important. Meanwhile, as an application technology, it is employed to adjust variation in electrical characteristics in manufacturing steps of a device which is represented by a supply voltage conversion circuit by means of applying a redundant repair technology in which above fuse or the like is utilized. Further, like a field of the present invention, it is also proposed a technology in which above fuse element is replaced with a nonvolatile memory device constituted of a CMOS device which does not require physical processing and is electrically readable and writable (2001 IEEE International Solid-State Circuits Conference P380, 381, 467, 468).

By replacing the conventional fuse element with the CMOS device, physical processing will not be required, so that there is achieved an advantage on a circuit area that a layer on the fuse element may be utilized as an interconnection area.

However, since the CMOS device has required application of a high voltage for rewriting, it has been necessary to lay out a power supply interconnection so that the high voltage has been applied thereto from an external source outside the semiconductor device, and it has therefore been necessary to lay out the semiconductor devices so that interconnections other than that and semiconductor circuits adjacent to that interconnection path have not been influenced by the high voltage, that has resulted in constraints on the layout.

SUMMARY OF THE INVENTION

An object of the present invention is to provide a semiconductor device which can solve a problem of a layout in consideration of a high voltage application to a CMOS device.

In order to achieve the object described above, a semiconductor device of a first invention comprises a semiconductor memory circuit arranged in a center of a chip, a plurality of IO blocks which are arranged in a periphery of the chip, each supplying and producing a signal, and a supply potential or a ground potential, and a nonvolatile semiconductor memory circuit used for a redundant repair function of the semiconductor memory circuit, wherein the nonvolatile semiconductor memory circuit comprises a nonvolatile memory device constituted of an electrically readable and writable CMOS device, a control circuit for producing a control signal which controls writing to the nonvolatile memory device according to an address signal, an address signal line for supplying the address signal to the control circuit, an input data line for supplying data written to the nonvolatile memory device synchronizing with the control signal, and an output data line for producing data having been written to the nonvolatile memory device to the semiconductor memory circuit, wherein the nonvolatile semiconductor memory circuit is arranged between the plurality of IO blocks.

According to a semiconductor device of a second invention, in the semiconductor device of the first invention, the IO block comprises a plurality of transistors which have different gate oxide thicknesses, respectively.

According to a semiconductor device of a third invention, in the semiconductor device of the second invention, a transistor which constitutes the nonvolatile memory device is formed by employing the same process as that of forming a first transistor which has a first gate oxide thickness among a plurality of transistors constituting the IO block.

According to a semiconductor device of a fourth invention, in the semiconductor device of the second invention, a transistor which constitutes the control circuit is formed by employing the same process as that of forming a second transistor which has a second gate oxide thickness among the plurality of transistors constituting the IO block.

According to a semiconductor device of a fifth invention, in the semiconductor device of the first invention, the plurality of IO blocks are arranged along the periphery of the chip in a ring shape, and first and second power supply lines for supplying the supply potential to the IO block, and a third power supply line for supplying the ground potential to the IO block are interconnected in a ring shape so as to pass through over the plurality of IO blocks.

According to a semiconductor device of a sixth invention, in the semiconductor device of the fifth invention, a power supply line for supplying the supply potential to the nonvolatile semiconductor memory circuit is also used as the first and second power supply lines in a ring shape, and a power supply line for supplying the ground potential to the nonvolatile semiconductor memory circuit is also used as the third power supply line in a ring shape.

According to a semiconductor device of a seventh invention, in the semiconductor device of the fifth invention, the address signal line and the input data line in the nonvolatile semiconductor memory circuit are interconnected in a ring shape in parallel with the first and second, and third power supply lines.

According to a semiconductor device of a eighth invention, in the semiconductor device of the third invention, the plurality of IO blocks and a plurality of nonvolatile semiconductor memory circuits arranged between them are arranged in a ring shape along the periphery of the chip, and the transistor which constitutes the IO block and has a respective gate oxide thickness, and the transistor which constitutes the nonvolatile memory device of the nonvolatile semiconductor memory circuit are arranged in a ring shape.

According to a semiconductor device of a ninth invention, in the semiconductor device of the fourth invention, the plurality of IO blocks and the plurality of nonvolatile semiconductor memory circuits arranged therebetween are arranged in a ring shape along the periphery of the chip, and the transistor which constitutes the IO block and has a respective gate oxide thickness, and the transistor which constitutes the control circuit of the nonvolatile semiconductor memory circuit are arranged in a ring shape.

According to a semiconductor device of a tenth invention, in the semiconductor device of the first invention, data written to the nonvolatile memory device of the nonvolatile semiconductor memory circuit are used for fixing a gate of the semiconductor memory circuit.

According to a semiconductor device of an eleventh invention, in the semiconductor device of first or tenth invention, the nonvolatile semiconductor memory circuit is arranged in a location where a line length of the output data line which produces data having been written to the nonvolatile memory device to the semiconductor memory circuit may become minimum with respect to a physical arrangement location of the semiconductor memory circuit.

According to the present invention, by arranging the nonvolatile semiconductor memory circuit between the IO blocks, it will not be needed to supply a high voltage required for rewriting the CMOS device to an inside of the semiconductor device using a power supply interconnection while keeping an advantage on a circuit area that the upper interconnection can be freely utilized because physical processing of the device will not be needed due to replacing the conventional fuse element with the CMOS device. The internal interconnection and the semiconductor circuit may not therefore be influenced by the high voltage, thereby making it possible to reduce a consideration on an arrangement.

DETAILED DESCRIPTION OF THE PREFERRED EMBODIMENT

Figure 1:
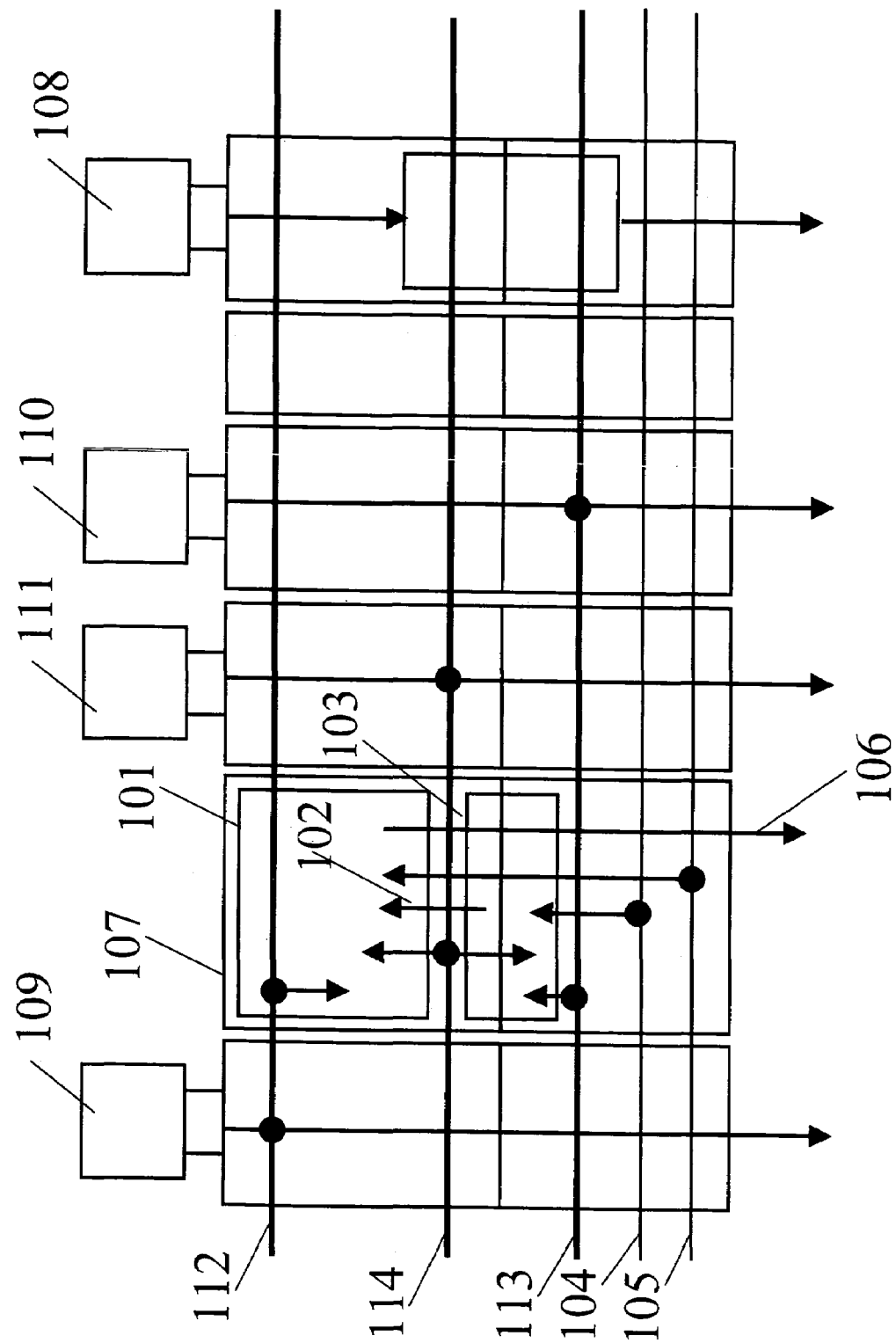
FIG. 1 is a layout pattern of a nonvolatile semiconductor memory circuit in a semiconductor device of an embodiment of the present invention.

Hereafter, referring to the drawings, description will be made of an embodiment of the present invention.

Figure 2:
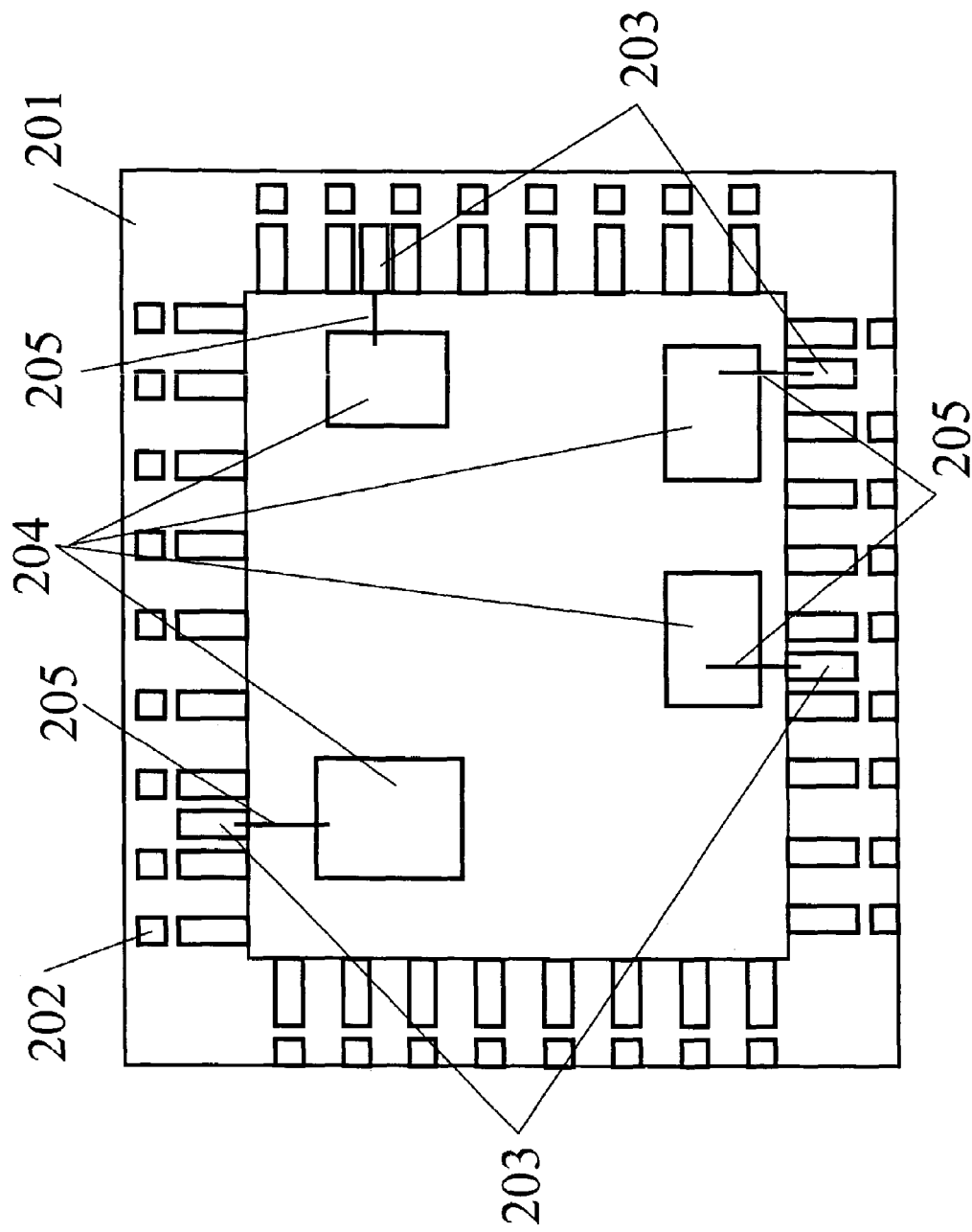
FIG. 2 is a layout pattern of a whole semiconductor device of the embodiment of the present invention.

FIG. 1 and FIG. 2 show a block diagram of a semiconductor device in accordance with the embodiment of the present invention. In FIG. 1, reference numeral 101 represents a nonvolatile memory device constituted of an electrically readable and writable CMOS device; reference numeral 102, a set of control signals for controlling a write to the nonvolatile memory device 101; reference numeral 103, a control circuit for producing the set of control signals; reference numeral 104, a set of address signals supplied to the control circuit 103; reference numeral 105, a data line for supplying data written to the nonvolatile memory device 101 synchronizing with the set of control signals; reference numeral 106, a data line for producing data written to the nonvolatile memory device 101; reference numeral 107, a nonvolatile semiconductor memory circuit; reference numeral 108, an IO block constituted of an input/output circuit for supplying/producing data and an electrode pad connected to the input/output circuit; reference numeral 109, an IO block for supplying a first supply potential V1; reference numeral 110, an IO block for supplying a second supply potential V2; reference numeral 111, an IO block for supplying a ground potential VS; reference numeral 112, a first power supply line connected to the IO block 109 which supplies the first supply potential V1; reference numeral 113, a second power supply line connected to the IO block 110 which supplies the second supply potential V2; and reference numeral 114, a ground potential line connected to the IO block 111 which supplies the ground potential VS.

In FIG. 2, reference numeral 201 represents the semiconductor device; reference numeral 202, the IO block (reference numeral 108 through reference numeral 111 in FIG. 1); reference numeral 203, then on volatile semi conductor memory circuit (reference numeral 107 in FIG. 1); reference numeral 204, a semiconductor circuit which is represented by the memory and repaired by a redundant repair treatment; and reference numeral 205, a signal line for connecting the nonvolatile semiconductor memory circuit 203 to the semiconductor circuit 204.

A whole layout of the semiconductor device of this embodiment is shown in FIG. 2, and an internal configuration of the nonvolatile semiconductor memory circuit 203 and its vicinity among them are shown in FIG. 1. The nonvolatile semiconductor memory circuit 107 in FIG. 1 corresponds to the nonvolatile semiconductor memory circuit 203 in FIG. 2. Meanwhile, the output data line 106 corresponds to the signal line 205.

As shown in FIG. 1, the nonvolatile semiconductor memory circuit 107 is comprised of the nonvolatile memory device 101 which is constituted of the electrically readable and writable CMOS device and the control circuit 103. The control circuit 103 produces the set of control signals 102 for controlling a write to the nonvolatile memory device 101 by the supplied set of address signals 104, and By the data line 105 which supplies data written to the nonvolatile memory device 101 synchronizing with the set of control signals 102, the data are written in the nonvolatile memory device 101. The data written in the nonvolatile memory device 101 are produced via the data line 106 (signal line 205 in FIG. 2), and are sent to the semiconductor circuit 204.

This nonvolatile semiconductor memory circuit 203 (107) is arranged between a plurality of IO blocks 202 arranged in a ring shape along a periphery of the semiconductor device 201 (chip) as shown in FIG. 2, and may be arranged in a location where a wiring length of the signal line 205 becomes minimum or where an interconnection of the signal line 205 is performed most easily depending on a location of the semiconductor circuit 204 to be connected. Each of a power supply line D1 (not shown) for supplying the first supply potential V1 to the IO block 109 among the plurality of IO blocks 202, a power supply line D2 (not shown) for supplying the second supply potential V2 to the IO block 110 among them, and a power supply line D3 (not shown) for supplying the ground potential VS to the IO block 111 among them is arranged in a ring shape passing through over the plurality of IO blocks 202.

The semiconductor circuit 204 comprises a normal memory cell area provided with a plurality of memory cells, and a redundant memory cell area provided with a plurality of spare memory cells, and is a memory circuit which repairs using a method of replacing a faulty memory cell in the normal memory cell area with a memory cell in the redundant memory cell area. For this replacement, there is taken a method of switching a route so that a redundant memory cell may be accessed when an address which accesses a faulty memory cell is supplied. For this reason, a circuit for memorizing an address of a faulty memory cell or a circuit for switching a route is embedded in the semiconductor circuit 204, and they operate by fixing some gates. Said some of gates are fixed using a value stored in a plurality of nonvolatile semiconductor memory circuits 203 (107).

Incidentally, the nonvolatile semiconductor memory circuit 107 may be constituted of a plurality of memory devices 101 to memorize a plurality of values if a configuration of the semiconductor circuit 204 which receives the data of the output data line 106 is synchronized with the address signal of the address line 104.

According to this embodiment, the IO block 108 including a circuit for inputting/outputting a signal is constituted of transistor areas having two different gate oxide thicknesses (t1, t2). In addition, the IO block 109, 110, 111 which respectively supply potentials V1, V2, and VS are also constituted of transistor areas having two different gate oxide thicknesses (t1, t2), and embed protection elements which respectively protect overvoltage for power supply lines 112, 113, 114 connected to each of them. The IO blocks 108, 109, 110, 111 are therefore constituted using a transistor T1 having a gate oxide of the film thickness t1, and a transistor T2 having a gate oxide of the film thickness t2, respectively. Incidentally, they are not limited to be constituted using two types of transistors having gate oxides of two different film thicknesses, but may be constituted of three or more transistors (T1, T2, T3, . . . ) having gate oxides of three or more thicknesses.

The nonvolatile memory device 101 constituted of the electrically readable and writable CMOS device is formed by employing the same process as that of the transistor T1 having the gate oxide thickness t1 which constitutes the IO blocks 108, 109, 110, and 111, and an arrangement thereof becomes in a ring shape, thereby making it easy to form the same.

The transistor which constitutes the control circuit 103 is formed by employing the same process as that of the transistor T2 having the gate oxide thickness t2 which constitutes the IO blocks 108, 109, 110, and 111, and an arrangement thereof becomes in a ring shape similarly, thereby making it easy to form the same.

A relationship between the gate oxide thickness t1 of the nonvolatile memory device 101 or the like and the gate oxide thickness t2 of the transistor or the like which constitutes the control circuit 103 is given by t1>t2, and a relationship between the potential V1 of the power supply line 112 supplied to the nonvolatile memory device 101 or the like and the potential V2 of the power supply line 113 supplied to the control circuit 103 or the like is given by V1>V2.

It is constituted such that the power supply lines 112, 113, 114 are commonly used between the IO blocks 108, 109, 110, and 111 and the nonvolatile semiconductor memory circuit 107 for supplying the potentials V1, V2, and VS, and if it is arranged in a ring shape, the power supply interconnection is also constituted in a ring shape, thereby making the arrangement easy.

The address line 104 and the data line 105 to the control circuit 103 of the nonvolatile semiconductor memory circuit 107 are in parallel to the set of power supply lines 112, 113, 114 arranged in a ring shape, and similarly interconnected in a ring shape, thereby making the interconnection easy.

According to these constitutions, it is easy to arrange the nonvolatile semiconductor memory circuit 203 (107) between the IO blocks 202 (108, 109, 110, and 111). According to the present invention, by arranging the nonvolatile semiconductor memory circuit 203 between the IO blocks 202, it will not be needed to supply a high voltage required for rewriting the CMOS device to an inside of the semiconductor device using a power supply interconnection while keeping an advantage on a circuit area that the upper interconnection can be freely utilized because physical processing of the device will not be needed due to replacing the conventional fuse element with the CMOS device.

Moreover, by arranging the nonvolatile semiconductor memory circuit 203 between the IO blocks 202, physical processing due to replacing the conventional fuse element with the CMOS device will not be needed, so that while keeping an advantage on a circuit area that the upper interconnection can be utilized, it will not be needed to supply a high voltage required for rewriting the CMOS device to an inside of the semiconductor device using the power supply interconnection.

The internal interconnection and the semiconductor circuit may not therefore be influenced by the high voltage, thereby making it possible to reduce a consideration on an arrangement.

Some gates of the memory circuit 204 are fixed with the data written in the nonvolatile memory device 101 of the nonvolatile semiconductor memory circuit 203 (107), thereby making it possible to set a memory which replaces a faulty memory cell in said general memory cell area of the memory circuit 204 with a memory cell in the redundant memory cell area.

In FIG. 2, since the nonvolatile semiconductor memory device 203 of the present invention may be easily arranged between the plurality of IO blocks 202 in the semiconductor device 201, it can be arranged in a location where the interconnection of the signal line 205 is performed most easily in accordance with the arrangement of a set of semiconductor circuits 204 to be connected.

What is claimed is:

1. A semiconductor device, comprising:
    a semiconductor memory circuit arranged in a central area of a chip;
    a plurality of IO blocks which are arranged in a periphery of the chip, each inputting and outputting a signal, a supply potential or a ground potential; and
    a nonvolatile semiconductor memory circuit which is arranged in the periphery of the chip used for a redundant repair function of said semiconductor memory circuit,
    wherein said nonvolatile semiconductor memory circuit comprises
    a nonvolatile memory device constituted of an electrically readable and writable CMOS device,
    a control circuit for producing a control signal which controls writing to said nonvolatile memory device according to an address signal,
    an address signal line for supplying said address signal to said control circuit,
    an input data line for supplying data written to said nonvolatile memory device synchronizing with said control signal,
    an output data line for outputting data having been written to said nonvolatile memory device to said semiconductor memory circuit, wherein;
    said plurality of IO blocks is arranged in a ring shape along the periphery of the chip, and
    said nonvolatile semiconductor memory circuit is arranged between adjacent IO blocks of said plurality of IO blocks.

2. The semiconductor device according to claim 1, wherein said IO block comprises a plurality of transistors which have different gate oxide thicknesses, respectively.

3. The semiconductor device according to claim 2, wherein a transistor which constitutes said nonvolatile memory device is formed by employing the same process as that of forming a first transistor which has a first gate oxide thickness among a plurality of transistors constituting said IO block.

4. The semiconductor device according to claim 2, wherein a transistor which constitutes said control circuit is formed in the same process as that of forming a second transistor which has a second gate oxide thickness among a plurality of transistors constituting said IO block.

5. The semiconductor device according to claim 1, wherein first and second power supply lines for supplying the supply potential to said IO block, and a third power supply line for supplying the ground potential to said IO block are interconnected in a ring shape so as to pass through over said plurality of IO blocks.

6. The semiconductor device according to claim 5, wherein a power supply line for supplying the supply potential to said nonvolatile semiconductor memory circuit is also used as said first and second power supply lines in a ring shape, and a power supply line for supplying the ground potential to said nonvolatile semiconductor memory circuit is also used as said third power supply line in a ring shape.

7. The semiconductor device according to claim 5, wherein said address signal line and said input data line in said nonvolatile semiconductor memory circuit are interconnected in a ring shape in parallel with said first and second, and third power supply lines.

8. The semiconductor device according to claim 3, wherein a transistor which constitutes said IO block and has a respective gate oxide thickness, and said transistor which constitutes said nonvolatile memory device of said nonvolatile semiconductor memory circuit are arranged in a ring shape.

9. The semiconductor device according to claim 4, wherein a transistor which constitutes said IO block and has a respective gate oxide thickness, and said transistor which constitutes said control circuit of said nonvolatile semiconductor memory circuit are arranged in a ring shape.

10. The semiconductor device according to claim 1, wherein data written to the nonvolatile memory device of said nonvolatile semiconductor memory circuit are used for fixing a gate of said semiconductor memory circuit.

11. The semiconductor device according to claim 1, wherein said nonvolatile semiconductor memory circuit is arranged so as to be a located where a line length of the output data line which supplies data having been written to said nonvolatile memory device to said semiconductor memory circuit may become minimum with respect to a physical arrangement location of said semiconductor memory circuit.

* * * * *